United States Patent
Ginsburg et al.

(10) Patent No.: US 8,310,308 B1
(45) Date of Patent: Nov. 13, 2012

(54) WIDE BANDWIDTH CLASS C AMPLIFIER WITH COMMON-MODE FEEDBACK

(75) Inventors: Brian P. Ginsburg, Allen, TX (US); Vijay B. Rentala, Plano, TX (US); Srinath Ramaswamy, Murphy, TX (US); Baher Haroun, Allen, TX (US); Eunyoung Seok, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/149,376

(22) Filed: May 31, 2011

(51) Int. Cl.
*H03F 3/45* (2006.01)
(52) U.S. Cl. ........................................ 330/258
(58) Field of Classification Search .............. 330/258, 330/260
See application file for complete search history.

(56) References Cited

U.S. PATENT DOCUMENTS

| | | | |
|---|---|---|---|
| 5,721,500 A | 2/1998 | Karanicolas | |
| 6,265,941 B1 * | 7/2001 | Lopata | 330/258 |
| 6,549,074 B2 * | 4/2003 | Ugajin et al. | 330/258 |
| 7,592,870 B2 * | 9/2009 | Wang et al. | 330/258 |
| 2006/0082416 A1 | 4/2006 | Marholev | |

* cited by examiner

*Primary Examiner* — Khanh V Nguyen
(74) *Attorney, Agent, or Firm* — John J. Patti; Wade J. Brady, III; Frederick J. Telecky, Jr.

(57) ABSTRACT

A method for providing common-mode feedback is provided. A common-mode current is applied to a common-gate amplifier, and the common-mode current is sensed. In response to the sensed common-mode current, a control voltage is generated. A first feedback current (which is generated in response to the control voltage) can then be applied to differential ground of the common-gate amplifier if the common-mode current is less than a predetermined threshold. Additionally, a second feedback current (which is generated in response to the control voltage) can be applied to input terminals of the common-gate amplifier if the common-mode current is greater than the predetermined threshold.

20 Claims, 2 Drawing Sheets

WIDE BANDWIDTH CLASS C AMPLIFIER WITH COMMON-MODE FEEDBACK

TECHNICAL FIELD

The invention relates generally to amplifier and, more particularly, to class C amplifiers with common-mode feedback.

BACKGROUND

Pseudo-differential class C amplifiers have a common mode current draw that varies depending on the input swing, which may not be controllable. A common mode feedback loop is, therefore, usually employed, even in a resistively loaded wide bandwidth amplifier, to stabilize the output common-mode under the varying class C current. This common-mode feedback should reduce degradation of differential bandwidth and maintain a first settling time for rapid duty cycling. However, no such feedback circuit has been developed. Thus, there is a need for an improved class C amplifier with common-mode feedback.

Some examples of conventional circuits are: U.S. Pat. No. 5,721,500; and U.S. Patent Pre-Grant Publ. No. 2006/0082416.

SUMMARY

An embodiment of the present invention, accordingly, provides an apparatus. The apparatus comprises an input circuit having a first pair of differential output terminals and that provides a common-mode current; and an output circuit having: a second pair of output terminals; a first amplifier that is coupled to the first and second pairs of output terminals and that includes a resistor network; an second amplifier that is coupled to the resistor network so as to generate a control voltage from a sensed common-mode and a reference voltage; a first common-mode feedback circuit that is coupled the second amplifier so as to receive the control voltage and that is coupled to provide a first feedback current to the resistor network when the common-mode current is less than a predetermined threshold; and a second common-mode feedback circuit that is coupled to the second amplifier so as to receive the control voltage and that is coupled to provide a second current to the first pair of input terminals when the common-mode current is greater than a predetermined threshold.

In accordance with an embodiment of the present invention, the apparatus further comprises a supply rail, and wherein the first common-mode feedback circuit further comprises: a transistor having a first passive electrode, a second passive electrode, and a control electrode, wherein the first passive electrode of the transistor is coupled to the supply rail, and wherein the second passive electrode of the transistor is coupled to the resistor network, and wherein the control electrode of the transistor is coupled to the second amplifier; and a capacitor that is coupled between the control electrode and the second passive electrode of the transistor.

In accordance with an embodiment of the present invention, the transistor further comprises a first transistor, and wherein the second common-mode feedback circuit further comprises: a second transistor having a first passive electrode, a second passive electrode, and a control electrode, wherein the first passive electrode of the second transistor is coupled to the supply rail, and the control electrode of the second transistor is coupled the second amplifier, and wherein the second passive electrode of the second transistor is coupled to a first output terminal from the first pair of differential output terminals; and a third transistor having a first passive electrode, a second passive electrode, and a control electrode, wherein the first passive electrode of the third transistor is coupled to the supply rail, and the control electrode of the third transistor is coupled the second amplifier, and wherein the second passive electrode of the third transistor is coupled to a second output terminal from the first pair of differential output terminals.

In accordance with an embodiment of the present invention, the first amplifier further comprises: a fourth transistor having a first passive electrode, a second passive electrode, and a control electrode, wherein the first passive electrode of the fourth transistor is coupled to the resistor network, and wherein the second passive electrode of the fourth transistor is coupled to the first output terminal from the from the first pair of differential output terminals; a fifth transistor having a first passive electrode, a second passive electrode, and a control electrode, wherein the first passive electrode of the fifth transistor is coupled to the resistor network, and wherein the second passive electrode of the fifth transistor is coupled to the second output terminal from the from the first pair of differential output terminals, and wherein the control electrode of the fifth transistor is coupled to the control electrode of the fourth transistor; a first current minor that is coupled to the second passive electrode of the fourth transistor; and a second current minor that is coupled to the second passive electrode of the fifth transistor.

In accordance with an embodiment of the present invention, the apparatus further comprises an adjustment circuit that is coupled between the control electrode of the first transistor and the second amplifier so as to set the predetermined threshold.

In accordance with an embodiment of the present invention, the first, second, third, fourth, and fifth transistors further comprise bipolar transistors.

In accordance with an embodiment of the present invention, the first second and third transistors further comprise PNP transistors, and wherein the fourth and fifth transistors further comprise NPN transistors.

In accordance with an embodiment of the present invention, an apparatus is provided. The apparatus comprises an input circuit having a first pair of differential output terminals and that provides a common-mode current; and an output circuit having: a second pair of output terminals; a common-gate amplifier that is coupled to the first and second pairs of output terminals and that includes a resistor network; a feedback amplifier that is coupled to the resistor network so as to generate a control voltage from a sensed common-mode and a reference voltage; a first common-mode feedback circuit that is coupled the feedback amplifier so as to receive the control voltage and that is coupled to provide a first feedback current to the resistor network when the common-mode current is less than a predetermined threshold; and a second common-mode feedback circuit that is coupled to the feedback amplifier so as to receive the control voltage and that is coupled to provide a second current to the first pair of input terminals when the common-mode current is greater than a predetermined threshold.

In accordance with an embodiment of the present invention, the apparatus further comprises a supply rail, and wherein the first common-mode feedback circuit further comprises: a MOS transistor that is coupled to the supply rail at its source, the resistor network at its drain, and the feedback amplifier at its gate; and a capacitor that is coupled between the gate and drain of the MOS transistor.

In accordance with an embodiment of the present invention, the MOS transistor further comprises a first MOS transistor, and wherein the second common-mode feedback circuit further comprises: a second MOS transistor that is coupled to the supply rail at its source, the feedback amplifier at its gate, and a first output terminal from the first pair of differential output terminals at its drain; and a third MOS transistor that is coupled to the supply rail at its source, the feedback amplifier at its gate, and a second output terminal from the first pair of differential output terminals at its drain.

In accordance with an embodiment of the present invention, the common-gate amplifier further comprises: a fourth MOS transistor that is coupled to the resistor network at its drain and the first output terminal from the from the first pair of differential output terminals at its source; a fifth MOS transistor that is coupled to the resistor network at its drain, the second output terminal from the from the first pair of differential output terminals at its source, and the gate of the fourth MOS transistor at its gate; a first current mirror that is coupled to the source of the fourth MOS transistor; and a second current mirror that is coupled to the source of the fifth MOS transistor.

In accordance with an embodiment of the present invention, the first second and third transistors further comprise PMOS transistors, and wherein the fourth and fifth transistors further comprise NMOS transistors.

In accordance with an embodiment of the present invention, the resistor network further comprises: a first divider that is coupled to between the drains of the fourth and fifth MOS transistors and that is coupled to the drain of the first MOS transistor; a second divider that is coupled between the drains of the fourth and fifth MOS transistors; and a third divider that is coupled between the drains of the fourth and fifth MOS transistors and that is coupled to the feedback amplifier.

In accordance with an embodiment of the present invention, the first divider further comprises a first pair of resistors coupled in series with one another and coupled to the drain of the first MOS transistor, and wherein the second divider further comprises a second pair of resistors coupled in series with one another and coupled to the supply rail, and wherein the third divider further comprises a third pair of resistors coupled in series with one another and coupled to the feedback amplifier.

In accordance with an embodiment of the present invention, the first, second, and third MOS transistors are scaled with respect to one another to set the predetermined threshold.

In accordance with an embodiment of the present invention, the apparatus further comprises an adjustment circuit that is coupled between the gate of the first transistor and the feedback amplifier so as to set the predetermined threshold.

In accordance with an embodiment of the present invention, the first, second, and third MOS transistors having different threshold-voltages with respect to one another to set the predetermined threshold.

In accordance with an embodiment of the present invention, a method is provided. The method comprises applying a common-mode current to a common-gate amplifier; sensing the common-mode current; generating a control voltage in response to the sensed common-mode current; applying a first feedback current to differential ground of the common-gate amplifier if the common-mode current is less than a predetermined threshold, wherein the first feedback is generated in response to the control voltage; and applying a second feedback current to input terminals of the common-gate amplifier if the common-mode current is greater than the predetermined threshold, wherein the second feedback is generated in response to the control voltage.

In accordance with an embodiment of the present invention, the method further comprises applying a static current to the common-gate amplifier.

In accordance with an embodiment of the present invention, the method further comprises shifting the control voltage prior to the step of applying the first feedback current, wherein the shift in the control voltage sets the predetermined threshold.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
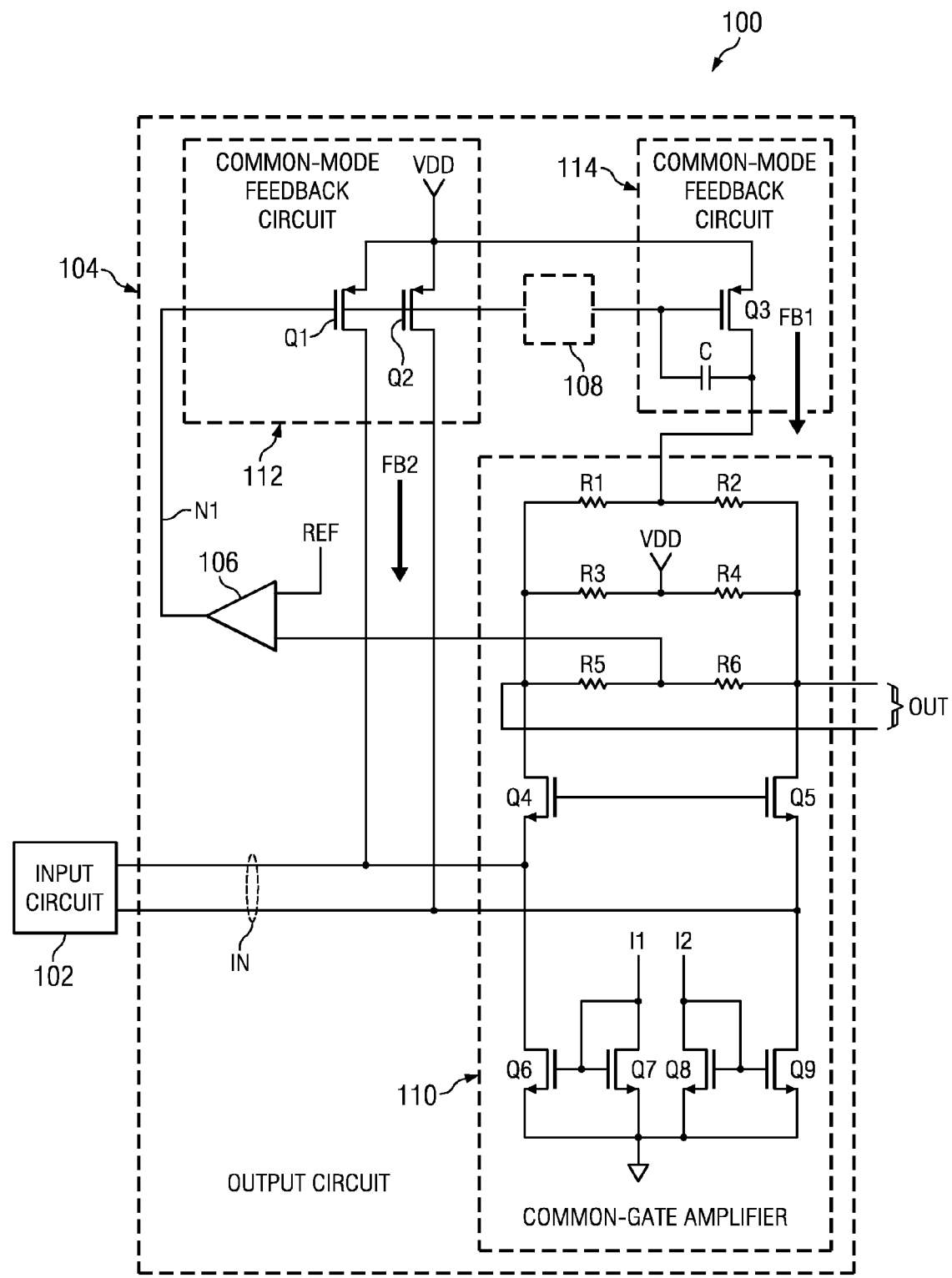
FIG. 1 is a diagram of an example of an amplifier in accordance with an embodiment of the present invention.

Refer now to the drawings wherein depicted elements are, for the sake of clarity, not necessarily shown to scale and wherein like or similar elements are designated by the same reference numeral through the several views.

Turning to FIG. 1, an example of a class C amplifier 100 in accordance with an embodiment of the present invention can be seen. In operation, the output circuit 104 is able to "split" and distribute the common-mode feedback to differential ground or to nodes with higher frequency differential poles. Generally, the input circuit 102 (which can, for example, be a downconversion mixer) draws (or provides) a common-mode current that is dependant on its input swing. This common-mode current is drawn (or provided) through terminals IN, which are coupled to the inputs of the common-gate (or common-base) amplifier 110. Namely, these terminals IN are coupled to the sources (or emitters) of transistors Q4 and Q5 (which can, for example, be NMOS or NPN transistors). Each of these transistors Q4 and Q5 is coupled to a resistor network (i.e., resistors R1 through R6) that operate as a differential load resistor (which can for example be about 100Ω) for the amplifier 110. This resistor network can be separated into dividers (i.e., resistors R1/R2, R3/R4, and R5/R6) that are coupled between the drains (or collectors) of transistors Q4 and Q5. The divider that includes resistors R3 and R4 can operate as the common-mode load resistance (where each resistor R3 and R4 can, for example, have a resistance of about 540Ω) that can improve common-mode stability by moving the secondary common-mode pole, and the divider that includes resistors R5 and R6 (which can, for example, have resistances of about 1100Ω) can sense the common-mode current. Feedback amplifier 106 (which is typically a differential amplifier) is able to generate a control voltage (at node N1) by using the sensed common-mode voltage (i.e., from the divider including resistors R5/R6) and a reference voltage (i.e., about 1V). This control voltage from amplifier 106 can then be used by the common-mode feedback circuits 112 and 114 to generate feedback currents FB1 and FB2.

Looking first to feedback circuit 114, it is able to provide the feedback current FB1 for a low or small common-mode current (i.e., below a predetermined threshold). The feedback circuit 114 generally supplies the feedback current FB1 (which is typically limited to the difference between the voltage on supply rail VDD and voltage on terminals OUT divided by the resistance of the divider that includes resistors R1 and R2) to a node between resistors R1 and R2, and this is generally accomplished by the use of a transistor Q3 (which can, for example, be an PMOS or PNP transistor) and capacitor C. The node between resistors R1 and R2 operates as the differential ground for common-gate (or common-base) amplifier 110, and, by applying this feedback current FB1 to this node below the predetermined threshold, the bandwidth at the source of the cascode node of the common-gate (or common-base) amplifier 110 can be maximized, which can generally prevent secondary poles from lowering in frequency. If the secondary poles lower in frequency, common-mode stability and differential bandwidth can be reduced.

Turning now to the feedback circuit 112, it is able to provide feedback current FB1 when the common-mode current is above the predetermined threshold. Generally, the feedback circuit 112 is comprised of transistors Q1 and Q2 (which can, for example, be PMOS or PNP transistors). These transistors Q1 and Q2 (like transistor Q3) receive the control voltage from amplifier 106, but one difference is that the transistors Q1 and Q2 can provide an unlimited range. However, for low common-mode currents (below the predetermined threshold), feedback current 112 "steals" current from current minors Q6/Q7 and Q8/Q9. These current mirrors Q6/Q7 and Q8/Q9 (which can, for example, be NMOS or NPN transistors) are cascoded with transistors Q4 and Q5 and provide a generally static current to transistors Q4 and Q5. These static currents can generally function as a "keep alive" current that is generally prevent transistors Q4 and Q5 from being "shut off." Usually, transistors Q7 and Q8 receive currents I1 and I2 (which are generally an offset current plus a generally static common-mode current) which is mirrored through transistors Q6 and Q9 (which can, for example, be about 5 times larger than transistors Q7 and Q8). Thus, if feedback circuit 112 is used without feedback circuit 114, the feedback circuit 112 could "shut off" transistors Q4 and Q5, so by using the feedback circuit 112, instead, in conjunction with feedback circuit 114 (when the feedback circuit 114 is out-of-range), a greater maximum current delivery with a low degradation of bandwidth can be achieved, while also generally avoiding the loading on the dominant pole node.

In order to adjust be able to adjust the predetermined threshold, several different approaches can be employed. The threshold voltages for transistor Q3 can be set to a different level than that of transistors Q1 and Q2, or, alternatively, the size of transistor Q3 can be set to be different from the sizes of transistors Q1 and Q2. As another alternative, a voltage shift to the gate or base of transistor Q3 can be performed with adjustment circuit 108.

Figure 2:
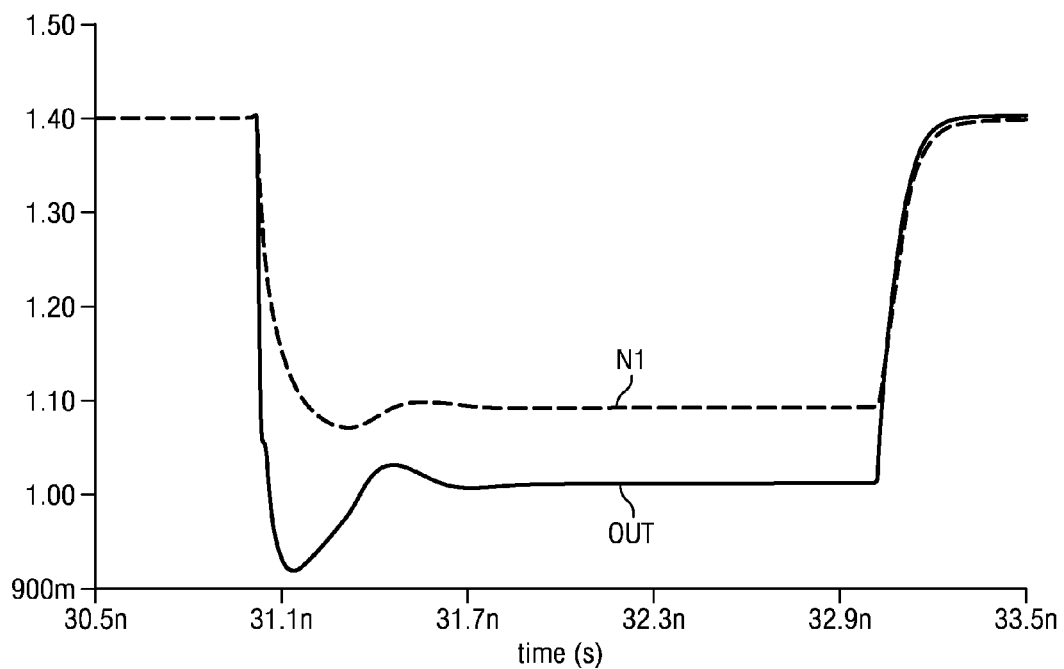
FIGS. 2 and 3 are diagrams illustrating the operation of the amplifier of FIG. 1.
Figure 3:
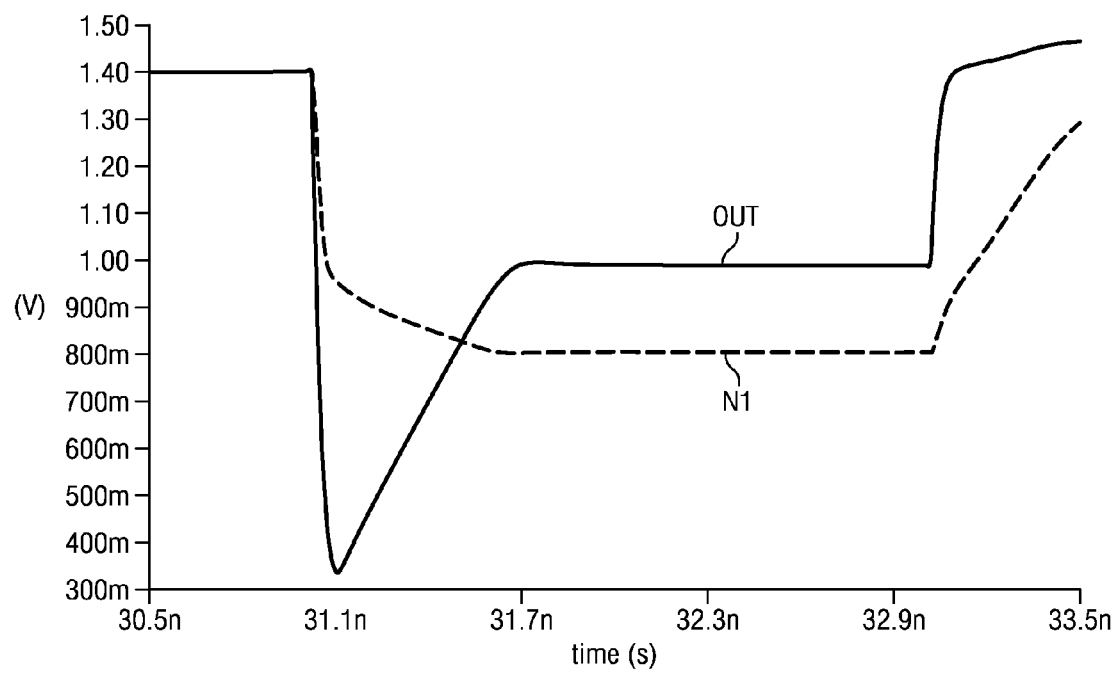

Turning now to FIGS. 2 and 3, examples of the operation of the amplifier 100 can be seen. In each of FIGS. 2 and 3, the signal on terminal OUT and node N1 can be seen, and for each case of a low common-mode current (as seen in FIG. 2) and a high common-mode current (as seen in FIG. 3), the output circuit 104 dramatically improves performance.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    an input circuit having a first pair of differential output terminals and that provides a common-mode current; and
    an output circuit having:
        a second pair of output terminals;
        a first amplifier that is coupled to the first and second pairs of output terminals and that includes a resistor network;
        an second amplifier that is coupled to the resistor network so as to generate a control voltage from a sensed common-mode and a reference voltage;
        a first common-mode feedback circuit that is coupled the second amplifier so as to receive the control voltage and that is coupled to provide a first feedback current to the resistor network when the common-mode current is less than a predetermined threshold; and
        a second common-mode feedback circuit that is coupled to the second amplifier so as to receive the control voltage and that is coupled to provide a second current to the first pair of differential output terminals when the common-mode current is greater than a predetermined threshold.

2. The apparatus of claim 1, wherein the apparatus further comprises a supply rail, and wherein the first common-mode feedback circuit further comprises:
    a transistor having a first passive electrode, a second passive electrode, and a control electrode, wherein the first passive electrode of the transistor is coupled to the supply rail, and wherein the second passive electrode of the transistor is coupled to the resistor network, and wherein the control electrode of the transistor is coupled to the second amplifier; and
    a capacitor that is coupled between the control electrode and the second passive electrode of the transistor.

3. The apparatus of claim 2, wherein the transistor further comprises a first transistor, and wherein the second common-mode feedback circuit further comprises:
    a second transistor having a first passive electrode, a second passive electrode, and a control electrode, wherein the first passive electrode of the second transistor is coupled to the supply rail, and the control electrode of the second transistor is coupled the second amplifier, and wherein the second passive electrode of the second transistor is coupled to a first output terminal from the first pair of differential output terminals; and
    a third transistor having a first passive electrode, a second passive electrode, and a control electrode, wherein the first passive electrode of the third transistor is coupled to the supply rail, and the control electrode of the third transistor is coupled the second amplifier, and wherein the second passive electrode of the third transistor is coupled to a second output terminal from the first pair of differential output terminals.

4. The apparatus of claim 3, wherein the first amplifier further comprises:
- a fourth transistor having a first passive electrode, a second passive electrode, and a control electrode, wherein the first passive electrode of the fourth transistor is coupled to the resistor network, and wherein the second passive electrode of the fourth transistor is coupled to the first output terminal from the first pair of differential output terminals;
- a fifth transistor having a first passive electrode, a second passive electrode, and a control electrode, wherein the first passive electrode of the fifth transistor is coupled to the resistor network, and wherein the second passive electrode of the fifth transistor is coupled to the second output terminal from the first pair of differential output terminals, and wherein the control electrode of the fifth transistor is coupled to the control electrode of the fourth transistor;
- a first current mirror that is coupled to the second passive electrode of the fourth transistor; and
- a second current mirror that is coupled to the second passive electrode of the fifth transistor.

5. The apparatus of claim 4, wherein the apparatus further comprises an adjustment circuit that is coupled between the control electrode of the first transistor and the second amplifier so as to set the predetermined threshold.

6. The apparatus of claim 4, wherein the first, second, third, fourth, and fifth transistors further comprise bipolar transistors.

7. The apparatus of claim 6, wherein the first, second and third transistors further comprise PNP transistors, and wherein the fourth and fifth transistors further comprise NPN transistors.

8. An apparatus comprising:
- an input circuit having a first pair of differential output terminals and that provides a common-mode current; and
- an output circuit having:
  - a second pair of output terminals;
  - a common-gate amplifier that is coupled to the first pair of differential output terminals and second pairs of output terminals and that includes a resistor network;
  - a feedback amplifier that is coupled to the resistor network so as to generate a control voltage from a sensed common-mode and a reference voltage;
  - a first common-mode feedback circuit that is coupled the feedback amplifier so as to receive the control voltage and that is coupled to provide a first feedback current to the resistor network when the common-mode current is less than a predetermined threshold; and
  - a second common-mode feedback circuit that is coupled to the feedback amplifier so as to receive the control voltage and that is coupled to provide a second current to the first pair of differential output terminals when the common-mode current is greater than a predetermined threshold.

9. The apparatus of claim 8, wherein the apparatus further comprises a supply rail, and wherein the first common-mode feedback circuit further comprises:
- a MOS transistor that is coupled to the supply rail at its source, the resistor network at its drain, and the feedback amplifier at its gate; and
- a capacitor that is coupled between the gate and drain of the MOS transistor.

10. The apparatus of claim 9, wherein the MOS transistor further comprises a first MOS transistor, and wherein the second common-mode feedback circuit further comprises:
- a second MOS transistor that is coupled to the supply rail at its source, the feedback amplifier at its gate, and a first output terminal from the first pair of differential output terminals at its drain; and
- a third MOS transistor that is coupled to the supply rail at its source, the feedback amplifier at its gate, and a second output terminal from the first pair of differential output terminals at its drain.

11. The apparatus of claim 10, wherein the common-gate amplifier further comprises:
- a fourth MOS transistor that is coupled to the resistor network at its drain and the first output terminal from the from the first pair of differential output terminals at its source;
- a fifth MOS transistor that is coupled to the resistor network at its drain, the second output terminal from the from the first pair of differential output terminals at its source, and the gate of the fourth MOS transistor at its gate;
- a first current mirror that is coupled to the source of the fourth MOS transistor; and
- a second current mirror that is coupled to the source of the fifth MOS transistor.

12. The apparatus of claim 11, wherein the first, second and third transistors further comprise PMOS transistors, and wherein the fourth and fifth transistors further comprise NMOS transistors.

13. The apparatus of claim 11, wherein the resistor network further comprises:
- a first divider that is coupled to between the drains of the fourth and fifth MOS transistors and that is coupled to the drain of the first MOS transistor;
- a second divider that is coupled between the drains of the fourth and fifth MOS transistors; and
- a third divider that is coupled between the drains of the fourth and fifth MOS transistors and that is coupled to the feedback amplifier.

14. The apparatus of claim 13, wherein the first divider further comprises a first pair of resistors coupled in series with one another and coupled to the drain of the first MOS transistor, and wherein the second divider further comprises a second pair of resistors coupled in series with one another and coupled to the supply rail, and wherein the third divider further comprises a third pair of resistors coupled in series with one another and coupled to the feedback amplifier.

15. The apparatus of claim 14, wherein the apparatus further comprises an adjustment circuit that is coupled between the gate of the first transistor and the feedback amplifier so as to set the predetermined threshold.

16. The apparatus of claim 14, wherein the first, second, and third MOS transistors are scaled with respect to one another to set the predetermined threshold.

17. The apparatus of claim 14, wherein the first, second, and third MOS transistors having different threshold-voltages with respect to one another to set the predetermined threshold.

18. A method comprising:
- applying a common-mode current to a common-gate amplifier;
- sensing the common-mode current;
- generating a control voltage in response to the sensed common-mode current;
- applying a first feedback current to differential ground of the common-gate amplifier if the common-mode current is less than a predetermined threshold, wherein the first feedback is generated in response to the control voltage; and applying a second feedback current to input terminals of the common-gate amplifier if the common-mode current is greater than the predetermined threshold, wherein the second feedback is generated in response to the control voltage.

19. The method of claim 18, wherein the method further comprises applying a generally static current to the common-gate amplifier.

20. The method of claim 19, wherein the method further comprises shifting the control voltage prior to the step of applying the first feedback current, wherein the shift in the control voltage sets the predetermined threshold.

* * * * *